(12) United States Patent
Guan

(10) Patent No.: US 8,018,676 B2
(45) Date of Patent: Sep. 13, 2011

(54) OPTIMIZED WRITE POLE FLARE ANGLE FOR SIDE SHIELD OR SEMI SIDE SHIELD PMR WRITER APPLICATION

(75) Inventor: Lijie Guan, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 12/930,755

(22) Filed: Jan. 14, 2011

(65) Prior Publication Data

US 2011/0116190 A1 May 19, 2011

Related U.S. Application Data

(62) Division of application No. 11/787,015, filed on Apr. 13, 2007, now Pat. No. 7,872,835.

(51) Int. Cl.
*G11B 5/127* (2006.01)
(52) U.S. Cl. ............................. 360/125.02; 29/603.13
(58) Field of Classification Search ............ 360/119.02, 360/125.01, 125.02, 125.3; 29/603.13
See application file for complete search history.

(56) References Cited

U.S. PATENT DOCUMENTS

| | | | |
|---|---|---|---|
| 6,198,597 B1 | 3/2001 | Tateyama et al. | |
| 6,504,675 B1 | 1/2003 | Shukh et al. | |
| 6,950,277 B1 | 9/2005 | Nguy et al. | |
| 7,002,775 B2* | 2/2006 | Hsu et al. | 360/125.03 |
| 7,159,302 B2 | 1/2007 | Feldbaum et al. | |
| 7,417,824 B2 | 8/2008 | Kameda | |
| 7,477,481 B2 | 1/2009 | Guthrie et al. | |
| 7,508,628 B2 | 3/2009 | Che et al. | |
| 7,649,712 B2* | 1/2010 | Le et al. | 360/125.3 |
| 7,672,079 B2 | 3/2010 | Li et al. | |
| 7,764,469 B2 | 7/2010 | Ho et al. | |
| 7,777,987 B2* | 8/2010 | Guan et al. | 360/125.3 |
| 7,804,666 B2 | 9/2010 | Guan et al. | |
| 7,934,310 B2* | 5/2011 | Guan et al. | 29/603.16 |
| 2007/0177301 A1* | 8/2007 | Han et al. | 360/126 |
| 2008/0297945 A1 | 12/2008 | Han et al. | |

OTHER PUBLICATIONS

"One Terabit per Square Inch Perpendicular Recording Conceptual Design," by M. Mallary et al., IEEE Transactions on Magnetics, vol. 38, No. 4, Jul. 2002, pp. 1719-1724.
Co-pending U.S. Appl. No. 12/930,332, filed Jan. 4, 2011, "Optimized Write Pole Flare Angle for Side Shield or Semi Side Shield PMR Writer Application," assigne to the same assignee as the present invention, 28 pgs.

* cited by examiner

*Primary Examiner* — Angel A. Castro
(74) *Attorney, Agent, or Firm* — Saile Ackerman LLC; Stephen B. Ackerman

(57) ABSTRACT

Improved writability and a reduction in adjacent track erasure are achieved in a PMR writer with a large flare angle of 45 and 90 degrees in the main write pole and a full side shield or partial side shield configuration around the narrow write pole section and write pole tip. A trailing shield is formed above the write pole's top surface and a full or partial side shield section is spaced a certain distance from each side of the write pole. The partial side shield has a thickness less than that of the write pole and a top or bottom surface about coplanar with the pole tip's top or bottom edge, respectively. The partial side shield may include two sections on each side of the write pole wherein the bottom surface of a top section is separated by a certain distance from the top surface of a bottom section.

13 Claims, 5 Drawing Sheets

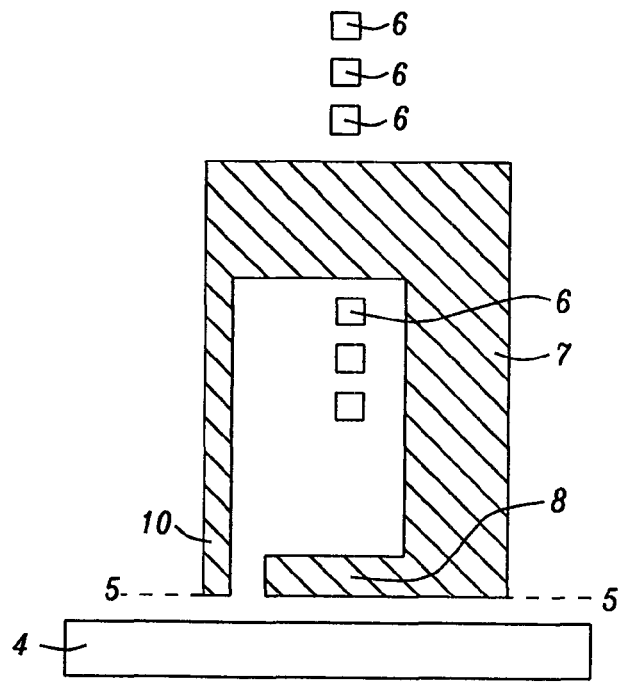
FIG. 1 – Prior Art
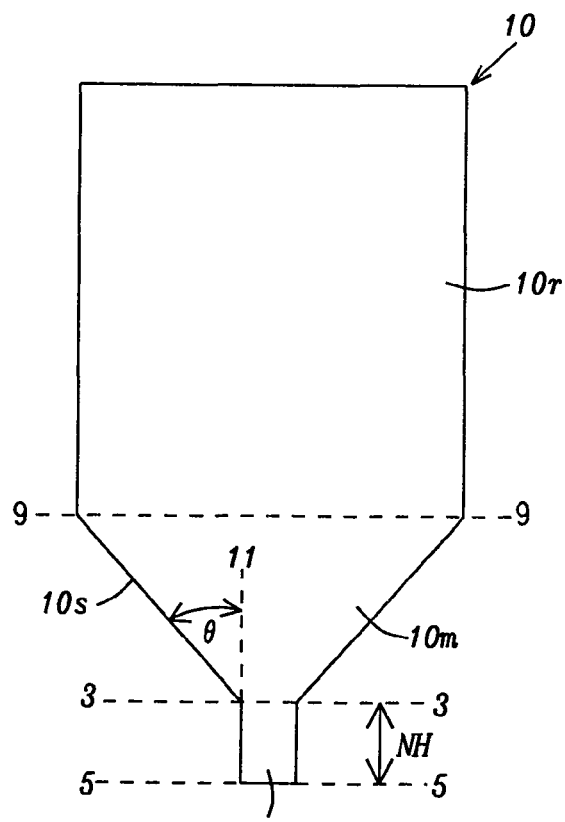
FIG. 2 – Prior Art

OPTIMIZED WRITE POLE FLARE ANGLE FOR SIDE SHIELD OR SEMI SIDE SHIELD PMR WRITER APPLICATION

This is a Divisional application of U.S. patent application Ser. No. 11/787,015, filed on Apr. 13, 2007, now U.S Pat. No. 7,872,835,which is herein incorporated by reference in its entirety, and assigned to a common assignee.

RELATED PATENT APPLICATIONS

This application is related to the following: Ser. No. 11/787,016, filing date Apr. 13, 2007; Ser. No. 11/809,346, filing date May 31, 2007; and Ser. No. 12/930,332, filing date Jan. 4, 2011, which are herein incorporated by reference in their entirely and assigned to a common assignee.

FIELD OF THE INVENTION

The invention relates to a PMR writer having a main pole layer with a large flare angle and a side shield or semi side shield configuration around the write pole at the air bearing surface (ABS) plane to improve writability and cross track field gradient for narrow track widths.

BACKGROUND OF THE INVENTION

Perpendicular magnetic recording (PMR) has been developed in part to achieve higher recording density than is realized with longitudinal magnetic recording (LMR) devices and is believed to be the successor of LMR for next generation magnetic data storage products and beyond. A single pole writer combined with a soft magnetic underlayer has the intrinsic advantage of delivering higher write field than LMR heads. A conventional PMR write head as depicted in FIG. 1 typically has a main (write) pole 10 with a small surface area (pole tip) at an air bearing surface (ABS) 5 and a flux return pole (opposing pole) 8 which is magnetically coupled to the write pole through a trailing shield 7 and has a large surface area at the ABS. Magnetic flux in the write pole layer 10 is generated by coils 6 and passes through the pole tip into a magnetic recording media 4 and then back to the write head by entering the flux return pole 8. The write pole concentrates magnetic flux so that the magnetic field at the write pole tip at the ABS is high enough to switch magnetizations in the recording media 4. A trailing shield is added to improve the field gradient in the down-track direction.

In FIG. 2, a top view is shown of a typical write pole layer 10 otherwise known as the main pole layer or main write pole. The write pole 10 has a narrow section 10n that extends a neck height (NH) distance from the ABS plane 5-5 to a plane 3-3 parallel to the ABS where a middle section 10m having sides 10s flares out at an angle $\theta$ from a dashed line 11 that is an extension of one of the sides of narrow section 10n. There is also a third main write pole section 10r that has one end at the plane 9-9 where the flared sides 10s terminate and extends a certain distance away from the plane 9-9 in a direction perpendicular to the ABS.

To achieve high areal recording density with PMR technology, key requirements for the PMR writer design are to provide large field magnitude and high field gradient in both down-track and cross-track directions. In practice, these two requirements are often traded off with each other to balance the overall performance. There are two approaches to achieve these requirements. One approach involves optimizing the geometry of the main write pole such as modifying the values for NH and flare angle $\theta$. A short NH or large $\theta$ can increase write field magnitude effectively. However, too short of a NH leads to problems of meeting process tolerance during manufacturing while too large of a flare angle $\theta$ may cause a large amount of adjacent track erasure because of a large fringe field. In today's commercial PMR writer products, NH is generally above 0.1 micron and flare angle $\theta$ is kept less than 45 degrees. A second design approach involves applying magnetic shield structure in the vicinity of the main write pole as described by M. Mallary in "One Terabit per Square Inch Perpendicular Recording Conceptual Design", IEEE, Trans. Magn., Vol. 38, July, 2002. To further improve cross-track field gradient, a full side shield writer structure is used to limit the excessive fringe field onto the adjacent track. Depending on the spacing between the side shield and the write pole, field magnitude could drop below the minimal performance requirement. As a result, flux intensity will be reduced at the ABS and writability will decrease.

As recording density keeps increasing, the trade-off between writability and field gradient becomes more challenging. Therefore, all the design elements must be integrated and optimized simultaneously to achieve best performance. Unfortunately, none of the prior art structures provide satisfactory control of field magnitude and field gradient in both the down-track and cross-track directions. Therefore, an improved write structure is necessary to achieve the high performance required for advanced devices with narrow track widths and high recording density.

Another improvement that is needed with PMR writers is to minimize the amount of pole erasure that occurs when the write pole is comprised of high Bs material. When the current in the coils is turned off, the magnetic field at the write pole tip should ideally be zero to prevent unintended writing to the magnetic medium. In actual practice, there may be a residual field retained at the write pole tip that has a magnitude sufficient enough to cause unwanted writing to the magnetic medium. Current technology has not satisfactorily addressed this concern and better PMR write design features are desirable in order to reduce pole erasure.

A search of the prior art revealed the following references. In U.S. Patent Application Publication 2005/0219744, a leading edge taper with an angle of 45 to 50 degrees is formed between a write pole tip and a magnetic flux guide to create sufficient magnetic flux in the write pole. U.S. Patent Application Publication 2006/0044677 describes a write pole layer that has a lower portion with a side that forms an angle of 80 to 85 degrees with respect to the bottom edge of the write pole tip. U.S. Pat. No. 6,504,675 describes a PMR writer with a write pole that has a trapezoidal cross-section at the ABS. To suppress the skew effect, the slope angle of the pole sides may be greater than the maximum skew angle in a drive.

U.S. Pat. No. 6,198,597 discloses a write head in which a rear body of a magnetic pole is connected at an angle of 90 to 120 degrees to the front body of the magnetic pole. Opposite end parts on the rear body are curved to promote convergence of the magnetic fluxes.

U.S. Pat. No. 6,950,277 describes a write pole having a concave shaped downstream side to optimize field curvature reduction. Adjacent to the write pole is a trailing shield with a convex upstream side that conforms to the curvature in the write pole.

In U.S. Patent Application Publication 2006/0098340, the main magnetic pole near the ABS in a PMR recording head is tilted at an angle of 1 to 6 degrees relative to a plane that is perpendicular to the ABS and parallel to the plane of the separation layer in order to reduce magnetization inversion noise.

U.S. Patent Application Publication 2006/0092569 describes a magnetic structure having a center rectangular shape with wing portions on two sides near the ABS. This configuration prevents excessive flux from accumulating within the structure and thereby prevents stray field writing. In related U.S. Patent Application Publication 2006/0092565, the magnetic structure may be modified to have a central forward extending portion with first and second laterally extending wings that curve away from the ABS to form rounded corners.

U.S. Patent Application Publication 2006/0002019 discloses a PMR writer that has a bilayer trailing shield gap layer between the main pole and trailing shield for improving writing and track width control.

SUMMARY OF THE INVENTION

One objective of the present invention is to provide a PMR writer structure that improves the cross-track field gradient while maintaining sufficient write field magnitude for applications with high recording density and having narrow track widths.

Another objective of the present invention is to provide a PMR writer structure according to the first objective that minimizes adjacent track erasure and improves writability at narrow track width.

Still another objective of the present invention is to provide a PMR writer structure that reduces the amount of pole erasure.

According to the present invention, these objectives are achieved in an improved design of a main write pole layer in combination with a side shield structure that improves writability and cross-track field gradient. The main write pole layer is comprised of a narrow write pole section having one end (pole tip) at the ABS plane and a second end along a second plane that is parallel to the ABS and located a neck height distance from the ABS when observed from a top view. There is a second write pole section with an end that adjoins one end of the narrow write pole section at the second plane wherein the second write pole section has a first side that flares outward at an angle $\theta$ between 45 and 90 degrees from a first side of the narrow section, and a second side that flares outward at an angle $\theta$ from a second side of the narrow section.

Viewed from the ABS plane, the pole tip has a leading or bottom edge, a top or trailing edge opposite the leading edge, and two sides that connect the leading and trailing edges. The top edge may have a greater width than the bottom edge and determines the track width. Adjacent to the narrow write pole section and a portion of the second section of the main write pole layer is a shield structure including a trailing shield and a side shield that may have various configurations. The trailing shield may have a rectangular shape with two long sides formed in a cross-track direction and two short sides perpendicular to the long sides. One long side is a bottom surface of the trailing shield that is formed at a certain distance from the top edge of the pole tip. A first short side is formed along a first plane that is parallel to the down track direction, and a second side is on a second plane on the opposite side of the write pole where the second plane is parallel to the first plane.

In one embodiment, the side shield structure is comprised of a full side shield having a section along each side of the narrow write pole section and pole tip where each section has a top surface, bottom surface, and a thickness that is essentially the same as the thickness of the pole tip in a down-track direction. The top surface of the side shield may be coplanar with the top surface of the narrow write pole section or slightly offset below the top surface. Likewise, the bottom surface of the side shield may be coplanar with the bottom surface of the narrow write pole section or slightly offset above the bottom surface. Each full side shield section also has a side essentially parallel to the nearest side of the narrow write pole section and separated from the nearest side by a certain distance (side gap). There is also a side of the first full side shield formed along the first plane and a side of the second full side shield formed along the second plane.

In a second embodiment, the full side shield design is replaced by a partial side shield having a thickness less the thickness of the pole tip and with two sections on opposite sides of the narrow write pole section that are separated from the nearest write pole side by a side gap distance. A first partial side shield section along one side of the pole tip has a top surface that is coplanar with the top surface of the narrow write pole section or slightly offset below the top edge and has a side that is essentially parallel to the nearest side of the narrow write pole section. Similarly, the second partial side shield section has a top surface coplanar with the top surface of the first partial side shield section and a side that is parallel to the nearest side of the narrow write pole section. There is also a side of the first partial side shield section formed along the first plane and a side of the second partial side shield section formed along the second plane.

In a third embodiment, another partial side shield design is disclosed wherein the thickness of the partial side shield is less than the thickness of the pole tip and the partial side shield has two sections on opposite sides of the narrow write pole section and pole tip that are separated from the nearest pole tip side by a side gap distance. A first partial side shield section along one side of the pole tip has a bottom surface that is coplanar with the bottom surface of the narrow write pole section or slightly offset above the bottom surface and has a side that is essentially parallel to the nearest side of the narrow write pole section. Similarly, the second partial side shield section has a bottom surface coplanar with the bottom surface of the first partial side shield section and a side that is parallel to the nearest side of the narrow write pole section. There is also a side of the first partial side shield section formed along the first plane and a side of the second partial side shield section formed along the second plane.

The present invention also encompasses a fourth embodiment wherein a partial side shield is formed that has two sections on each side of the narrow write pole section and pole tip. A first section on a first side has a top surface coplanar with or slightly offset below the top surface of the narrow write pole section and a bottom surface that is parallel to and spaced a certain distance from the top surface of the second section on the first side. The second section on the first side has a bottom surface that is coplanar with or slightly offset above the bottom surface of the narrow write pole section. Similarly, there is a first section on the second side of the narrow write pole section having a top surface coplanar with or slightly offset below the top surface of the narrow write pole section and a bottom surface that is parallel to and spaced a certain distance from the top surface of the second section on the second side. The second section on the second side has a bottom surface that is coplanar with or slightly offset above the bottom surface of the narrow write pole section. Each of the four sections has one side essentially parallel to the nearest side of the narrow write pole section and a second side formed along either the first or second plane.

There is a fifth embodiment that is the same as the second embodiment except for the addition of a leading shield below the bottom edge of the pole tip and narrow write pole section. The leading shield may have a rectangular shape with two longer sides formed parallel to the bottom edge of the write pole tip. In one embodiment, the length of the long sides in the leading shield is equivalent to the length of the long sides in the trailing shield. The long side of the leading shield nearest the write pole tip is the top surface and is formed a certain distance from the bottom edge of the write pole tip. One short side of the leading shield is formed on the first plane and the other short side is formed on the second plane.

From a top view, the side shield sections preferably conform to the narrow write pole section and to a portion of the main pole layer with flared sides adjacent to the narrow write pole section. In other words, each side shield section has a first side that is parallel to the sides of the narrow write pole section of the main pole layer and a second side connected to the first side that is parallel to a flared side in the second section of the main pole layer. A third side is formed along the ABS plane and a fourth side of the side shield may be perpendicular to the ABS plane and parallel to the first side and formed along the first or second plane.

BRIEF DESCRIPTION OF THE DRAWINGS

FIG. 1 is a cross-sectional view of a conventional PMR writer showing the main write pole, flux return pole, magnetic recording media, and coils that generate magnetic flux.

FIG. 2 is a top view showing a main write pole layer of a conventional PMR write head that has a narrow write pole section adjacent to the ABS and a larger section with sides that flare outward at an angle θ from the sides of the narrow write pole section.

DETAILED DESCRIPTION OF THE INVENTION

The present invention is a PMR writer comprised of a main write pole layer having top and bottom surfaces and two sides and includes a narrow write pole section with one end (pole tip) at the ABS and a second larger section that has sides which flare outward from the end of the narrow write pole section opposite the ABS. The PMR writer is also comprised of a shield structure with a trailing shield formed above the top surface of the narrow write pole section and a side shield with various configurations disposed on opposite sides of the main write pole layer. The drawings are provided by way of example and are not intended to limit the scope of the invention. Moreover, the elements in the figures are not necessarily drawn to scale and may have different relative sizes in an actual device.

Figure 3:
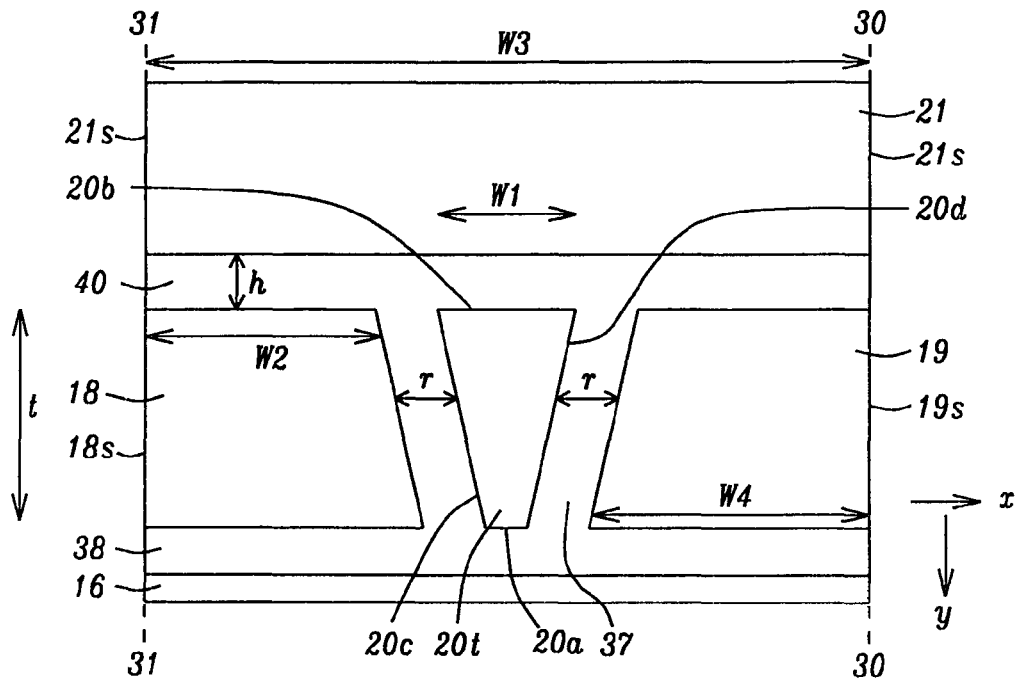
FIG. 3 is a cross-sectional view from an ABS plane that shows a PMR write head structure having a full side shield and a trailing shield according to one embodiment of the present invention.

Referring to FIG. 3, a cross-sectional view is shown from an ABS plane that represents a first embodiment of the present invention. There is a main write pole layer, hereafter referred to as the main write pole, having a surface (pole tip 20t) at the ABS comprised of a bottom edge 20a, a top edge 20b, and two sides 20c, 20d that is formed on a substrate 16 that may be a separation layer made of $Al_2O_3$ between a read head and a write head in a separated PMR read-write head, for example. However, the PMR writer is not limited to a separated PMR read-write head and may encompass other PMR writer configurations as appreciated by those skilled in the art. It should be understood that the main write pole has a bottom surface that terminates in the bottom edge 20a, and a top surface that terminates in the top edge 20b at the ABS. Furthermore, the substrate may be part of a slider (not shown) formed in an array of sliders on a wafer. After the PMR write head is completed, the wafer is sliced to form rows of sliders. Each row is typically lapped to afford an ABS before dicing to fabricate individual sliders that are used in a magnetic recording device.

Figure 8:
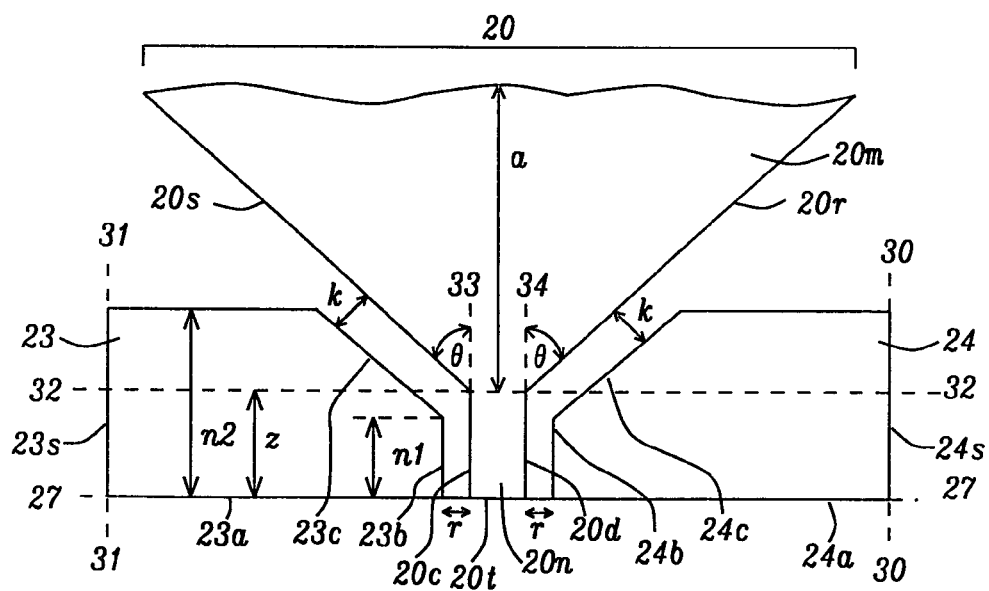
FIG. 8 is a top view of the PMR write head in FIG. 7 in which the trailing shield has been removed to show the write pole and partial side shield.

From a top view in FIG. 8, the main write pole 20 has a narrow section 20n formed between the ABS plane 27-27 and a parallel plane 32-32 that are separated by a neck height distance z. There is also a second section 20m whose sides 20s, 20r flare outward at an angle θ from the plane 32-32 with respect to dashed lines 33, 34 that are extensions of the narrow write pole section sides which are perpendicular to the ABS 27-27. The main write pole 20 may be deposited by an electroplating method and may be comprised of a material such as CoNiFe or FeCo that has a high saturation magnetic flux density (Bs) and a plated thickness of about 0.7 to 0.9 microns.

Returning to the exemplary embodiment in FIG. 3, the write pole tip 20t has a top edge 20b having a width $w_1$ at the ABS that is also known as the track width. In addition, there are two sides 20c, 20d that connect the ends of the top edge 20b and bottom edge 20a to form an inverted trapezoidal shape. The track width $w_1$ of 0.05 to 0.15 microns is wider than the width of the bottom edge 20a and is typically determined by an ion milling process that removes excess material from the sides of the main write pole layer. A chemical mechanical polish (CMP) step is typically employed to form a smooth pole tip 20t along the ABS plane. The thickness t of the write pole tip 20t is defined as the distance between the top edge 20b and bottom edge 20a along a line that is parallel to the y-axis and is about 0.15 to 0.30 microns. The top edge 20b and bottom edge 20a are part of a top surface and bottom surface, respectively, of the narrow write pole section and the aforementioned surfaces are oriented perpendicular to the ABS plane.

There is a trailing shield 21 above the write pole tip 20t that has two long sides formed parallel to the top edge 20b and top surface of the narrow write pole section and with a width $w_3$ in a cross-track (x-axis) direction. The long side that is closer to the top edge 20b is the bottom surface of the trailing shield 21 and is separated from the top edge by a distance h that is preferably about 0.03 to 0.10 microns. In one embodiment, the trailing shield 21 has a rectangular shape and one short side 21s that lies on a plane 30-30 and a second short side 21s that lies on a plane 31-31 wherein both of the aforementioned planes are parallel to the y-axis but are positioned on opposite sides of the write pole tip 20t. The sides of the trailing shield 21 extend a distance of about 1 to 10 microns away from the ABS and may partially overlap other portions of the main write pole (not shown) besides the narrow write pole section.

Furthermore, there is a full side shield having a section 18 on one side of the write pole tip 20t and a second section 19 on the opposite side of the write pole tip wherein the thickness of the sections 18, 19 is essentially equal to thickness t along the ABS plane. In one embodiment, the section 18 has a side 18s on the plane 31-31 and the section 19 has a side 19s on the plane 30-30. The top surfaces of the sections 18, 19 may be coplanar with the top edge 20b and the bottom surfaces of the full side shield sections may be coplanar with the bottom edge 20a. Optionally, the top surfaces and bottom surfaces of sections 18, 19 may be slightly offset by up to about 0.15 microns from the top edge 20b and bottom edge 20a, respectively, along the down-track axis (y-axis). The top surfaces of sections 18, 19 have a width $w_2$ and the bottom surfaces have a width $w_4$ in the cross-track direction wherein $w_2 < w_r$. The full side shield sections 18, 19 also have a side that is aligned essentially parallel to the nearest write pole side 20c, 20d, respectively, and spaced a distance r of about 0.04 to 0.10 microns from the nearest side of the write pole tip 20t. In one embodiment, the main write pole 20, trailing shield 21, and full side shield sections 18, 19 may be made of CoFe, CoFeNi, or NiFe or the like and may be deposited by a well known electroplating method on a seed layer (not shown), for example.

One fabrication sequence for forming the aforementioned magnetic elements is provided in related Headway application HT06-017 which is herein included by reference in its entirety. The gap 40 between the write pole tip 20t and trailing shield 21 may be filled with a write gap (WG) made of $Al_2O_3$, silicon oxide, or NiCu, for example. The space in the side gap 37 may be comprised of a trilayer configuration (not shown) having a lower side gap layer, a middle CMP stopper layer, and an upper magnetic seed layer that are deposited by an atomic layer deposition (ALD) method or the like. Gap 38 between the side shield sections 18, 19 and the substrate 16 may be comprised of a lower alumina layer (not shown) formed by a PVD method, for example, and a metal mask made of Ta, Ru, NiCr, Ti, or the like formed on the lower alumina layer.

Figure 4:
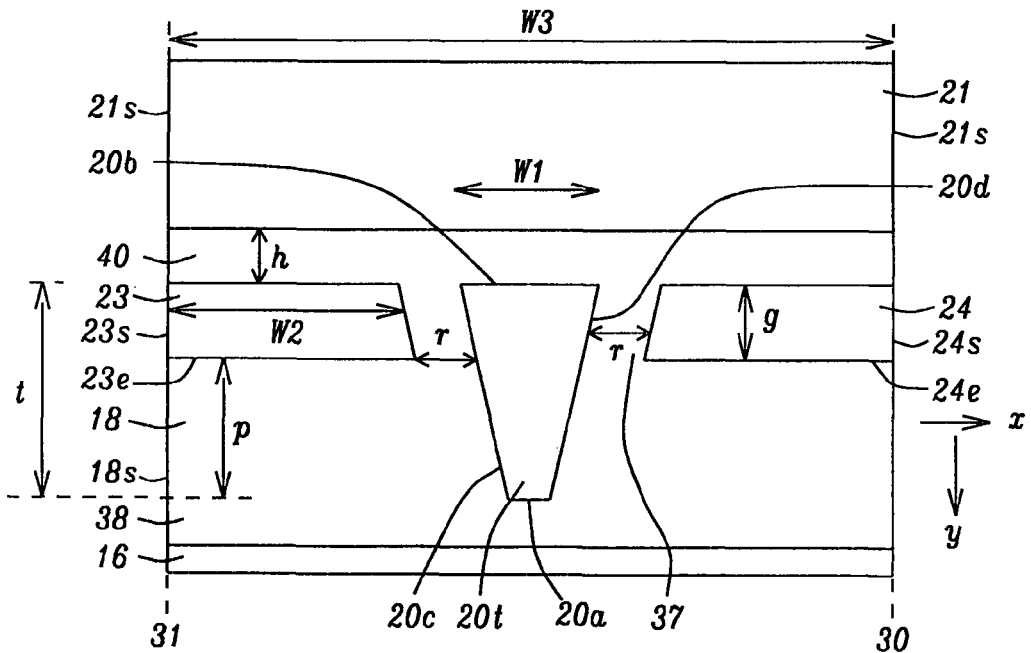
FIG. 4 is a cross-sectional view from an ABS plane that depicts a PMR write head structure with a partial side shield and a trailing shield according to a second embodiment of the present invention.

Referring to FIG. 4, the present invention also encompasses a second embodiment in which a partial side shield comprised of a first section 23 with a side 23s on the plane 31-31 and a second section 24 on the opposite side of the write pole tip 20t wherein the second section has a side 24s on the plane 30-30. In one aspect, the two sections 23, 24 each have a top and bottom surface, a side along a plane 31-31 or 30-30, and a side that is aligned essentially parallel to the nearest side 20c, 20d, respectively, and spaced a side gap distance r of about 0.04 to 0.10 microns from the nearest side of the write pole tip 20t. Note that the partial side shield has a thickness g in the down-track direction of about 0.05 to 0.15 microns which is less than the thickness t of the write pole tip 20t in the down track direction along the ABS plane between top edge 20b and bottom edge 20a. The top surfaces of the sections 23, 24 may be coplanar with the top edge 20b or the top surfaces of sections 23, 24 may be offset below the top edge 20b by a distance between 0 and 0.15 microns along the down-track axis. The top surfaces of sections 23, 24 have a width $w_2$ of 0.5 to 30 microns which is less than the width of the bottom surfaces 23e, 24e of the partial side shield sections 23, 24, respectively. The distance p between the bottom surfaces 23e, 24e and the bottom edge 20a in a direction parallel to the y-axis may be smaller or greater than thickness g. Note that g+p=t. There is also a trailing shield 21 as described earlier that is formed a distance h above the top edge 20b of the write pole tip 20t. Side shields 23, 24 are made of the same soft magnetic material such as CoFe, CoNiFe, or NiFe as in full side shield sections 18, 19.

Referring to FIG. 8, a top view of the main write pole 20 and partial side shield sections 23, 24 along with a larger section 20m of the main write pole is illustrated. The trailing shield 21 above the pole tip 20t has been removed to simplify the drawing. The narrow section 20n extends from the pole tip 20t at the ABS plane 27-27 to the plane 32-32 where the larger section 20m of the main pole layer flares outward at an angle θ with respect to the dashed lines 33, 34 that are extensions of the pole tip sides 20c, 20d, respectively. The distance z between the planes 27-27 and 32-32 is between 0 and about 0.2 microns and is also referred to as the neck height. The larger section 20m extends a distance a of about 0.1 to 20 microns away from the plane 32-32 in a direction perpendicular to the plane 32-32. The angle θ is preferably between 45 degrees and 90 degrees to help concentrate the magnetic flux from the main write pole at the pole tip 20t and to counter balance the flux leakage loss to the partial side shield sections 23, 24. Without the shield structure described in the present embodiment or in other embodiments involving a trailing shield and either a full or partial side shield, the large flare angle θ would cause too much fringe field at the adjacent track. It should be understood that the top view of the main write pole 20 as described with respect to FIG. 8 is the same in all embodiments of the present invention.

The process flow during fabrication is simplified by making the partial side shield sections 23, 24 conformal with the flared sides 20r, 20s of the main write pole. In other words, partial side shield section 23 has a side 23c that is essentially parallel to a portion of the flared side 20s that is adjacent to section 20n and is separated from the side 20s by a distance k that may be equal to r. Likewise, partial side shield section 24 has a side 24c that is essentially parallel to a portion of the flared side 20r adjacent to section 20n and is separated from the side 20r by a distance k. Partial side shield sections 23, 24 also have sides 23b, 24b, respectively, that are perpendicular to the ABS plane 27-27 and parallel to the narrow section 20n of the main write pole 20. In addition, there are sides 23s, 24s as mentioned previously that are formed along the planes 31-31 and 30-30, respectively. In the exemplary embodiment, the length $n_1$ of the sides 23b, 24b is about 0 to 0.2 microns and is less than the distance z of about 0 to 0.2 microns that separates plane 32-32 from the ABS plane 27-27 whereas length $n_2$ of the sides 23s, 24s is greater than the neck height distance z. In current commercial PMR writers, the neck height is typically greater than 0.1 micron and the flare angle θ is below 45 degrees.

Figure 5:
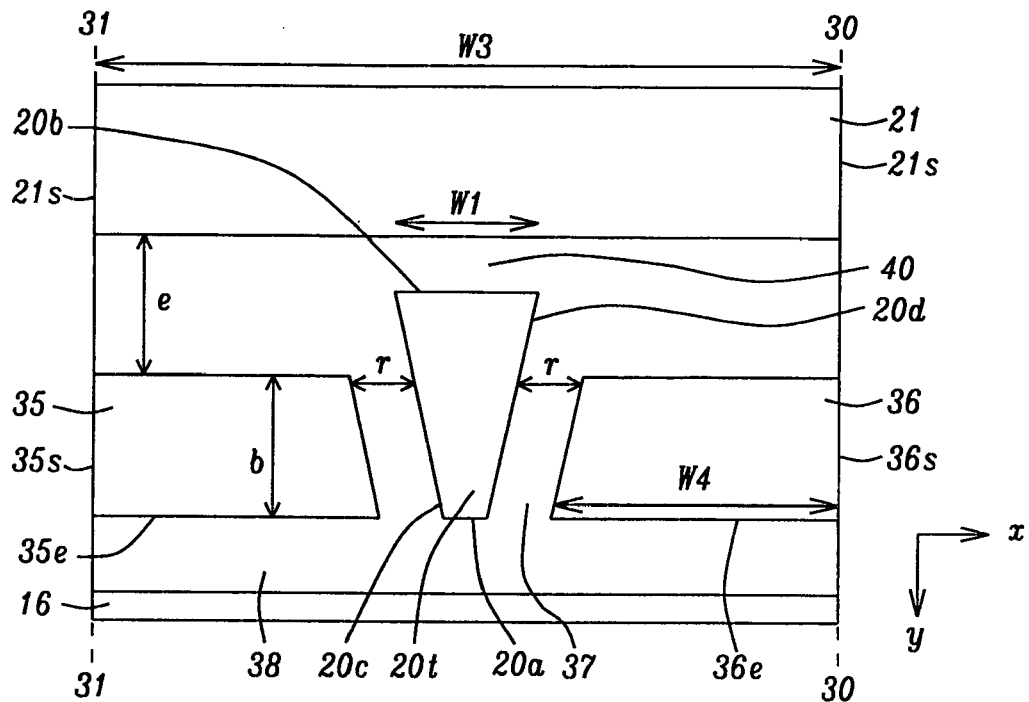
FIG. 5 is a cross-sectional view from an ABS plane that depicts a PMR write head structure with a partial side shield and a trailing shield according to a third embodiment of the present invention.

In FIG. 5, a third embodiment is depicted that also involves a partial side shield configuration in addition to the trailing shield 21 described previously. In this case, the two partial side shield sections 35, 36 are formed on opposite sides of the write pole tip 20t and narrow write pole section. Section 35 has a side 35s along the plane 31-31 and section 36 has a side 36s along the plane 30-30. In one aspect, the two sections 35, 36 each have a top and bottom surface, a side along a plane 31-31 or 30-30, and a side that is aligned essentially parallel to the nearest side 20c, 20d, respectively, and spaced a side gap distance r of about 0.04 to 0.10 microns from the nearest side of the write pole tip 20t. Note that the partial side shield sections 35, 36 have a thickness b in the down-track direction of about 0.05 to 0.25 microns which is less than the thickness t of the write pole tip 20t in the down track direction along the ABS plane. The bottom surfaces 35e, 36e of the sections 35, 36, respectively, may be coplanar with the bottom edge 20a or the bottom surfaces 35e, 36e may be offset by a distance between 0 and 0.15 microns above the bottom edge 20a along the down-track axis. The top surfaces of sections 35, 36 have a width that is less than the width $w_4$ of the bottom surfaces 35e, 36e. The distance e between the top surfaces of sections 35, 36 and the bottom surface of trailing shield 21 is greater than h and may be less than or greater than thickness b. Gaps 37, 38, 40 were described previously with respect to the first embodiment.

Figure 6:
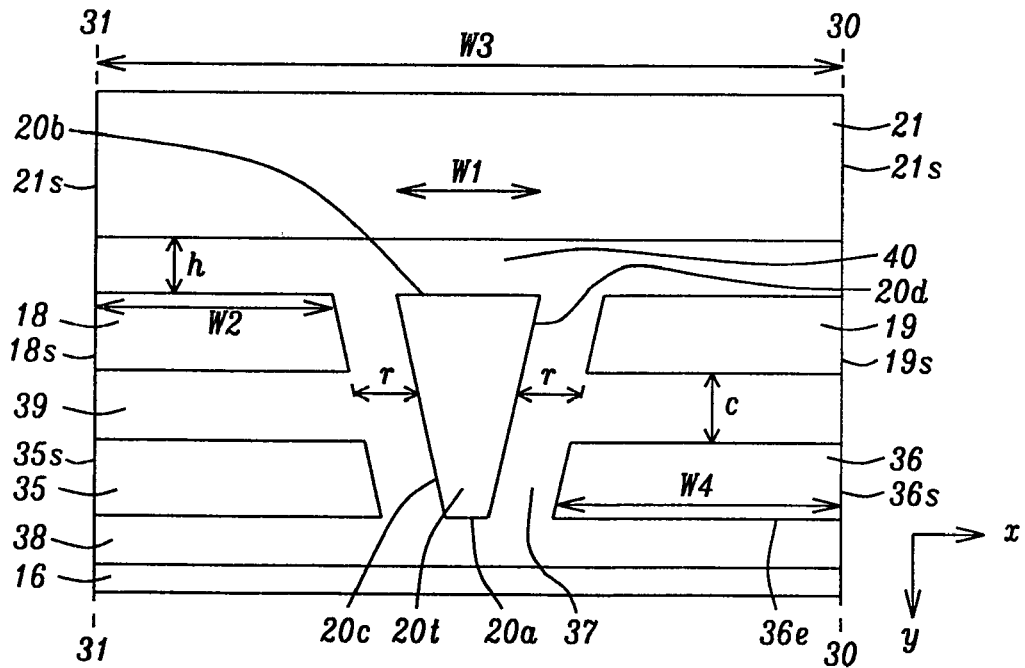
FIG. 6 is a cross-sectional view from the ABS plane showing a PMR write head structure having a partial side shield with two sections formed on each side of the write head according to fourth embodiment of the present invention.

Referring to FIG. 6, a fourth embodiment is shown in which there is a trailing shield 21 and a partial side shield configuration having two sections on each side of the narrow write pole section and write pole tip 20t. In one aspect, there are two sections 18, 35 on one side of the pole tip 20t and two sections 19, 36 formed on the other side of the pole tip. The sections 18, 19, 35, 36 were described previously. Note that there is a distance c of from 0.05 to 0.20 microns in the y-axis direction between the top surface of section 35 and bottom surface of section 18 and a similar spacing between the bottom surface of section 19 and top surface of section 36. The side gap distance r remains in effect between the pole tip side 20c and parallel sides of sections 18, 35, and between the pole tip side 20d and parallel sides of sections 19, 36.

Figure 7:
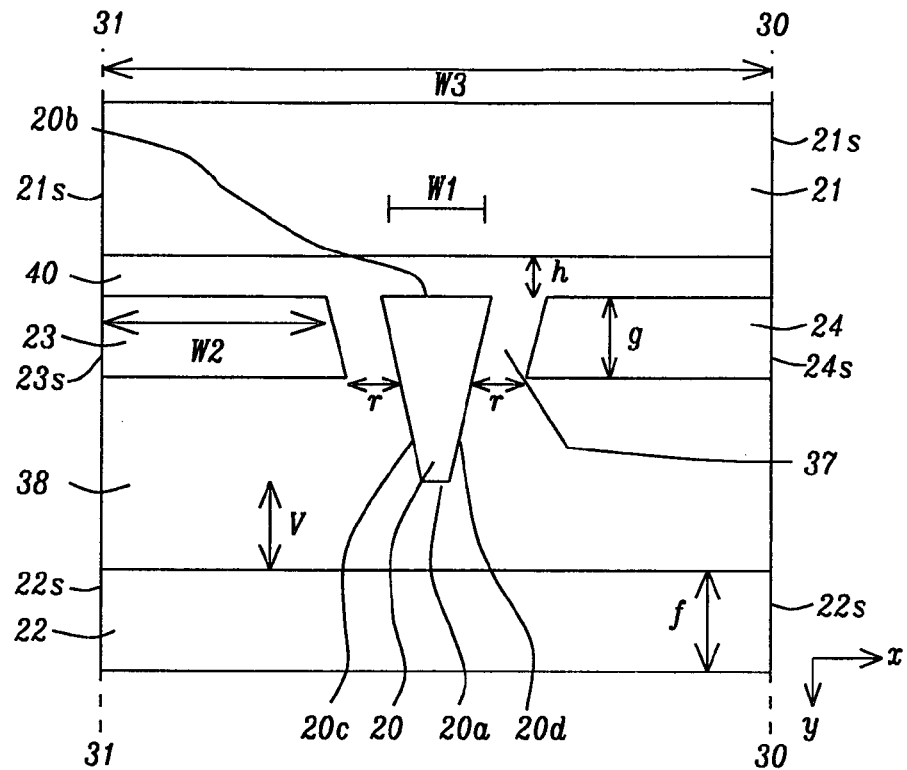
FIG. 7 is a cross-sectional view from the ABS plane showing a PMR write head having a leading shield, trailing shield, and partial side shield according to a fifth embodiment of the present invention.

Referring to FIG. 7, a fifth embodiment is depicted which is the same as the second embodiment except that a leading shield 22 is added to the shield structure and replaces substrate 16. The leading shield 22 has a thickness f of about 0.2 to 5.0 microns along the ABS plane. In the exemplary embodiment, the leading shield 22 has a rectangular shape with two long sides formed parallel to the bottom edge 20a and having a width $w_3$. The long side (top surface) nearest the bottom edge 20a is positioned a distance v of about 0.05 to 0.15 microns from the bottom edge 20a. One short side 22s lies on the plane 31-31 while the second short side 22s lies on the plane 30-30. This embodiment is similar to the shield structure disclosed in related Headway application HT06-033, which is herein included by reference in its entirety, except that no magnetic side connections are present. However, it should be understood by those skilled in the art, that magnetic connections may be added between two or more magnetic shield elements in all five embodiments disclosed herein without departing from the spirit of the invention. Magnetic side connections are added in some cases to ensure a correct magnetic potential in the shield elements.

Figure 9:
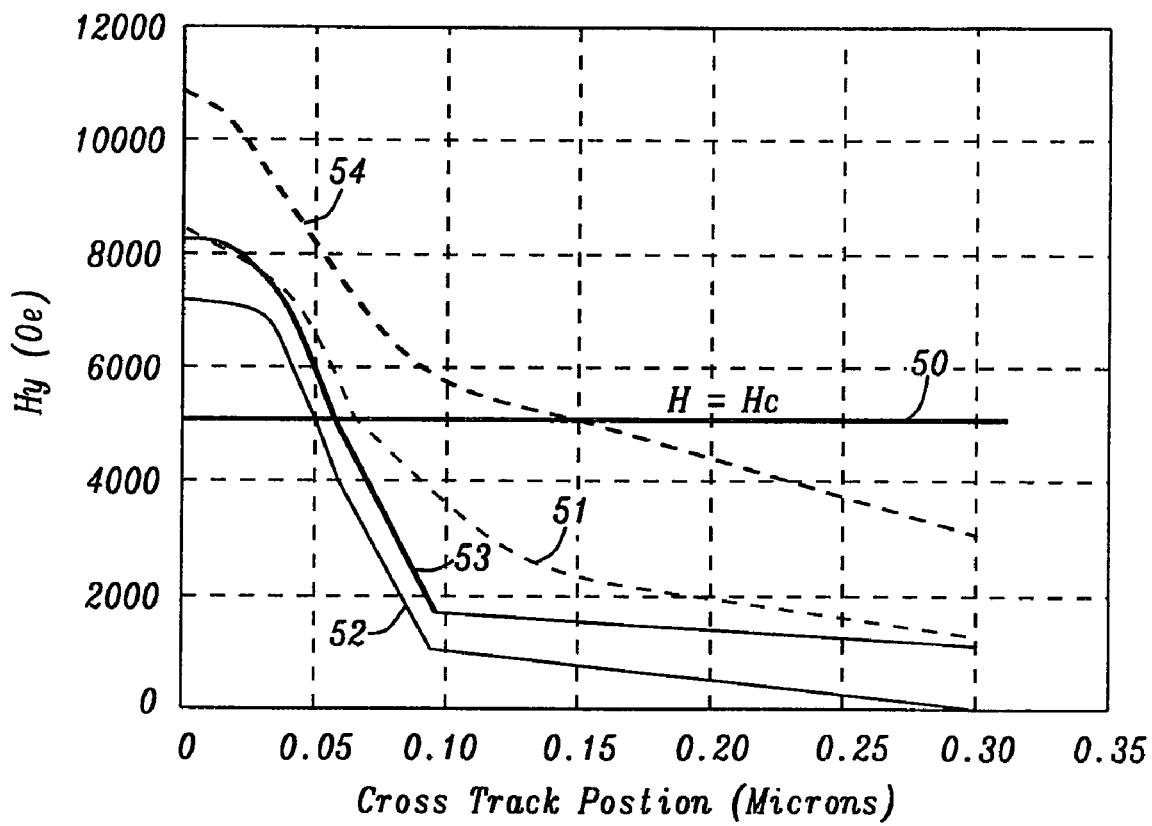
FIG. 9 is a graph illustrating the perpendicular field vs. distance to the writer pole center for various conventional PMR write head designs and for a PMR write head formed according to the present invention.

One advantage provided by the present invention is shown by a simulation in FIG. 9 where the magnitude of the perpendicular field component (Hy) is plotted as a function of cross track direction or distance to the write pole (pole tip) center along the x-axis. The horizontal line 50 in the plot is the constant H=Hc where Hc is media coercivity. The results represented by dashed line 51 are for a prior art design where the flare angle in the main write pole is 30 degrees and there is no side shield. Another prior art design demonstrates the effect of increasing the flare angle in the main write pole to 60 degrees when there is no side shield. Note that the thick dashed line 54 shows a higher field magnitude but at the expense of a much poorer field gradient for the 60 degree flare angle and no side shield example. The line 52 represents a prior art design where the flare angle is 30 degrees and a full side shield is added. The cross-track field gradient is improved compared with line 51 but there is an undesirable loss in field magnitude. On the other hand, a combination of large flare angle (θ=60 degrees) and a side shield structure according to the present invention generates an improved field gradient without compromising the field magnitude as indicated by solid line 53. As a result, a PMR writer that incorporates a shield structure according to the present invention will have improved writability and less erasure of adjacent tracks at narrow track width. Another advantage of the composite shield structure represented by embodiments in FIGS. 3-7 is that the fabrication process can be accomplished with existing methods and tools and in a simpler fashion than for the full side shield design in the prior art. Furthermore, it is believed that there will be less pole erasure when high Bs materials are used in the write pole tip because of the improved shield design disclosed herein.

While this invention has been particularly shown and described with reference to, the preferred embodiment thereof, it will be understood by those skilled in the art that various changes in form and details may be made without departing from the spirit and scope of this invention.

I claim:

1. A PMR write head, comprising:
   (a) a main write pole having a narrow write pole section with a pole tip at an ABS plane, a pole tip thickness in a down-track direction, two sides formed perpendicular to the ABS, a top surface with a top edge at the pole tip, and a bottom surface with a bottom edge at the pole tip, and a second section formed a certain distance from the ABS wherein the second section has two sides that flare out at a angle θ from the two sides of the narrow section at an end opposite the ABS, said end is a neck height distance from the ABS; and
   (b) a shield structure comprised of:
      (1) a trailing shield having a bottom surface formed a certain distance above said top surface of the narrow write pole section and separated therefrom by a gap layer, and two sides at the ABS that are parallel to the down track direction and formed along first and second planes, respectively; and
      (2) a side shield having a section formed on each side of the narrow write pole section wherein each side shield section has a top surface having a width at the ABS in a cross-track direction, a bottom surface parallel to the top surface and separated therefrom by a pole tip thickness, a side facing away from the narrow write pole section having a length less than the pole tip thickness and formed parallel to the down-track direction and along a first or second plane, a side having a length less than the neck height that is parallel to the nearest side of the narrow write pole section and spaced a side gap distance from said nearest side, and a side that is essentially parallel to the nearest flared side of the second section.

2. The PMR write head of claim 1 wherein the side shield is a partial side shield having a top surface that is about coplanar with the top surface of the narrow write pole section, said top surface has an offset of 0 to about 0.15 microns below the top edge of the pole tip along the down-track axis.

3. The PMR write head of claim 1 wherein the side shield is a partial side shield having a bottom surface that is about coplanar with the bottom surface of the narrow write pole section, said bottom surface of the partial side shield has an offset of 0 to about 0.15 microns above the bottom edge of the pole tip along the down-track axis.

4. The PMR write head of claim 2 wherein the shield structure is further comprised of a leading shield formed below the bottom surface of the narrow write pole section and having a top surface separated from the bottom edge of the pole tip, and a first side and second side that lie along the first plane and second plane, respectively.

5. A PMR write head, comprising:
(a) a main write pole layer having a narrow write pole section with a pole tip at an ABS plane, a pole tip thickness in a down-track direction, two sides formed perpendicular to the ABS, a top surface with a top edge at the pole tip, and a bottom surface with a bottom edge at the pole tip, and a second section formed a certain distance from the ABS wherein the second section has two sides that flare out at a angle θ from the two sides of the narrow section at an end opposite the ABS; and
(b) a shield structure comprised of:
  (1) a trailing shield having a bottom surface formed a certain distance above said top surface of the narrow write pole section, and two sides at the ABS that are parallel to the down track direction; and
  (2) a partial side shield having two sections formed on each side of the narrow write pole section wherein a top section on the first and second sides of the narrow write pole section has a top surface having a width at the ABS in a cross-track direction, a bottom surface parallel to the top surface, a side parallel to the down-track direction, and a side that is parallel to the nearest side of the narrow write pole section and spaced a second distance from said nearest side and wherein a bottom section on the first and second sides of the narrow write pole region has a bottom surface having a width at the ABS in a cross-track direction, a top surface parallel to the bottom surface, and a side parallel to the down-track direction, a side parallel to the nearest side of the narrow write pole section and spaced a second distance from said nearest side, said bottom surface of a top section and top surface of an underlying bottom section are separated by a third distance.

6. The PMR write head of claim 5 wherein a side of the trailing shield and the sides of the top and bottom sections on one side of the write pole tip that are parallel to the down track direction are formed along a first plane that is perpendicular to the ABS, and a second side of the trailing shield and the sides of the top and bottom sections on the opposite side of the write pole tip that are parallel to the down-track direction are formed along a second plane that is perpendicular to the ABS.

7. The PMR write head of claim 5 wherein angle θ is between about 45 degrees and 90 degrees.

8. The PMR write head of claim 5 wherein the top surface of the top sections in the partial side shield lie on a plane that is offset from the top surface of the narrow write pole section by a distance of 0 to about 0.15 microns below the top edge of the pole tip.

9. The PMR write head of claim 5 wherein the bottom surface of the bottom sections in the partial side shield lie on a plane that is offset from the bottom surface of the narrow write pole section by a distance of 0 to about 0.15 microns above the bottom edge of the pole tip.

10. The PMR write head of claim 5 wherein the third distance is between about 0.05 and 0.15 microns.

11. The PMR write head of claim 5 wherein the main write pole layer and shield structure are comprised of CoFe, CoFeNi, NiFe, or other soft magnetic materials.

12. The PMR write head of claim 5 wherein the distance between the ABS plane and the end of the narrow write pole section opposite the ABS is from 0 to about 0.2 microns.

13. The PMR write head of claim 5 wherein the second distance is a side gap distance of about 0.04 to 0.10 microns.

* * * * *